United States Patent [19]

Briggs

[11] Patent Number: 4,707,797

[45] Date of Patent: Nov. 17, 1987

[54] FUNCTION GENERATOR FOR NMR SYSTEM

[75] Inventor: Randal L. Briggs, Billerica, Mass.

[73] Assignee: Advanced NMR Systems, Inc., Woburn, Mass.

[21] Appl. No.: 713,785

[22] Filed: Mar. 20, 1985

[51] Int. Cl.⁴ .......................... G06F 15/31; G06J 1/00
[52] U.S. Cl. ..................................... 364/607; 324/307; 364/484; 364/718; 364/415
[58] Field of Search ............... 364/484, 486, 487, 607, 364/608, 718, 719, 720, 721, 722, 851; 324/307, 322; 307/529; 377/47, 50

[56] References Cited

U.S. PATENT DOCUMENTS

| | | | |
|---|---|---|---|
| 3,716,705 | 2/1973 | Newell | 364/719 |
| 3,735,389 | 5/1973 | Tarczy-Hornoch | 364/718 |
| 4,011,516 | 3/1977 | Heimbigner et al. | 377/50 |
| 4,099,240 | 7/1978 | Rode et al. | 364/607 |
| 4,222,108 | 9/1980 | Braaten | 364/608 |
| 4,342,245 | 8/1982 | Gross | 364/718 |
| 4,410,955 | 10/1983 | Burke et al. | 364/718 |
| 4,525,673 | 6/1985 | Berkowitz | 364/312 |
| 4,525,795 | 6/1985 | Rubin | 364/721 |

Primary Examiner—Errol A. Krass
Assistant Examiner—Daniel W. Juffernbruch
Attorney, Agent, or Firm—Ostrolenk, Faber, Gerb & Soffen

[57] ABSTRACT

A modular function generator for generating a plurality of analog waveforms for use in an NMR imaging system. The function generator includes a plurality of waveform synthesizer modules which are interconnected by a main bus to a central controller CPU. Each synthesizer is adapted to produce one analog waveform for the NMR imaging system. A synthesizer module includes a memory and an address sequencer which produces a sequence of addresses which control the retrieval of data from the memory. Each data world of the memory contains several fields. An instruction field and a general data field control the address sequencer so that the sequence of addresses is, in turn, controlled by the memory data. Other fields from the memory define analog and digital outputs produced by the synthesizer module. The fields are generated by program control means which are organized to have data segments which define a set of elementary analog waveform segments and subroutines which are controlled by a main program. The execution of each subroutine produces a segment of an analog waveform. The subroutines generate a segment by accessing given data segments and concatenating a plurality of elementary segments into a single analog output. A plurality of synthesizer modules are interconnected by an interchannel communications bus which allows each synthesizer to signal every other synthesizer whereby the operations of the synthesizers can be synchronized.

41 Claims, 12 Drawing Figures

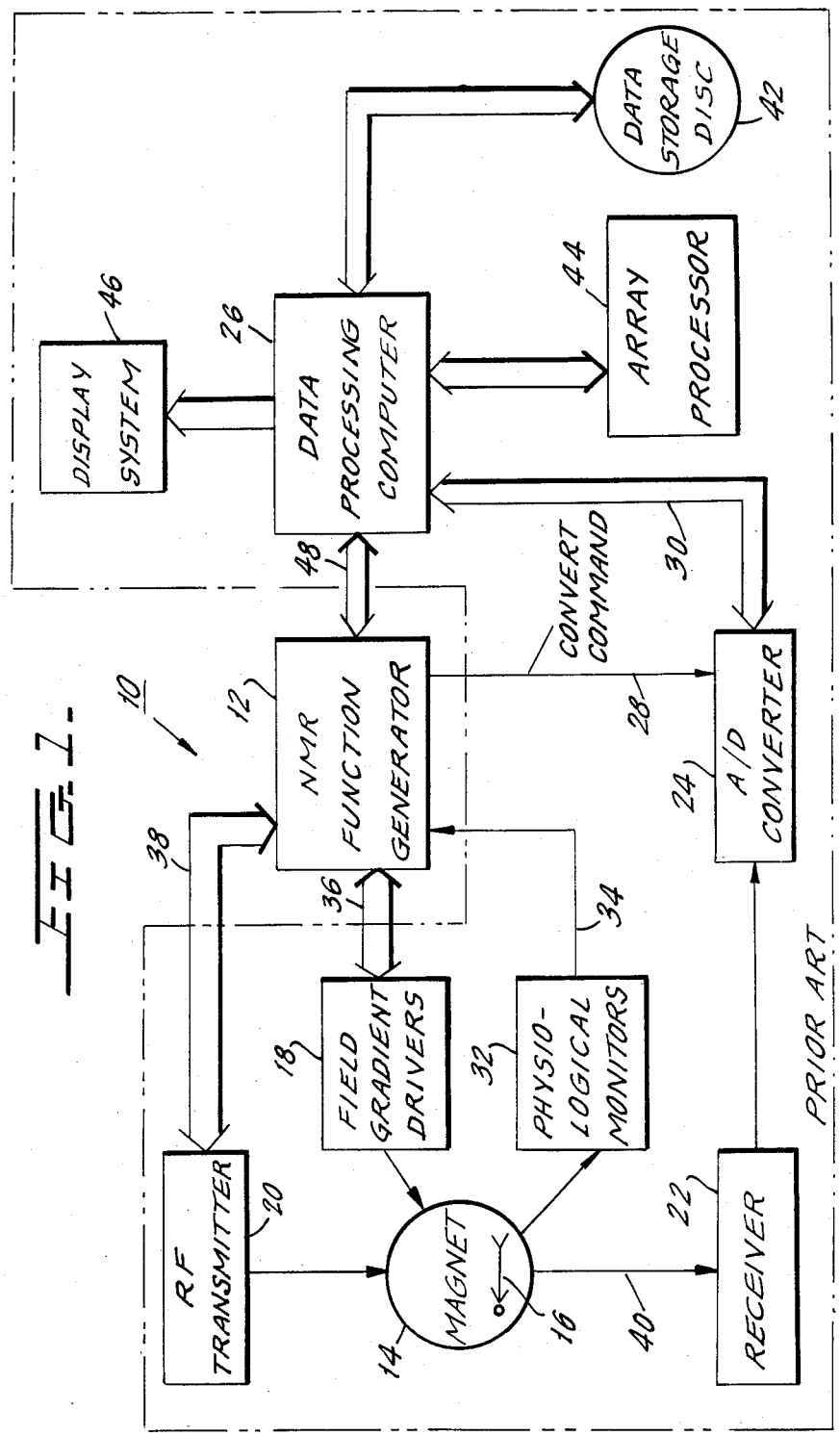

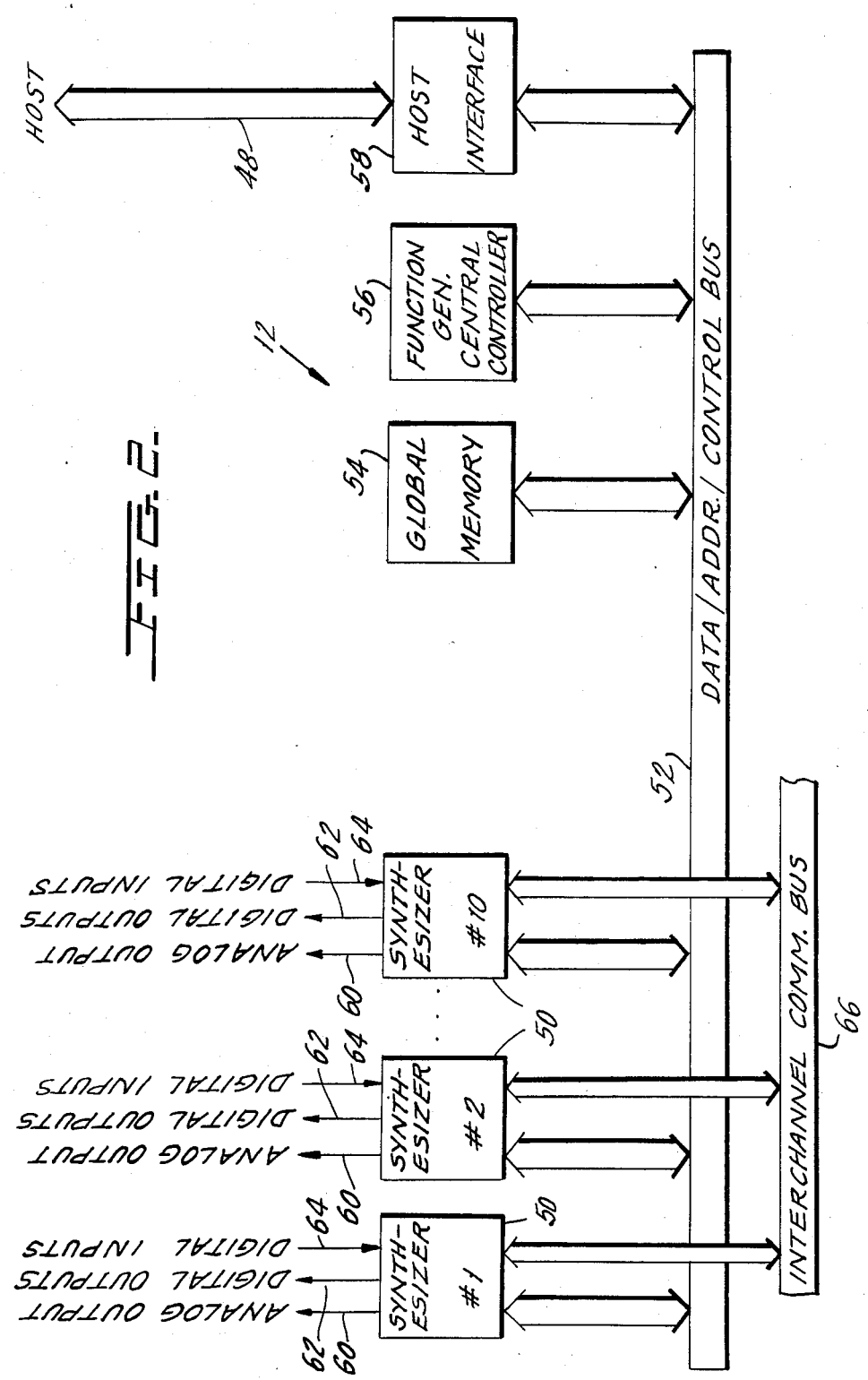

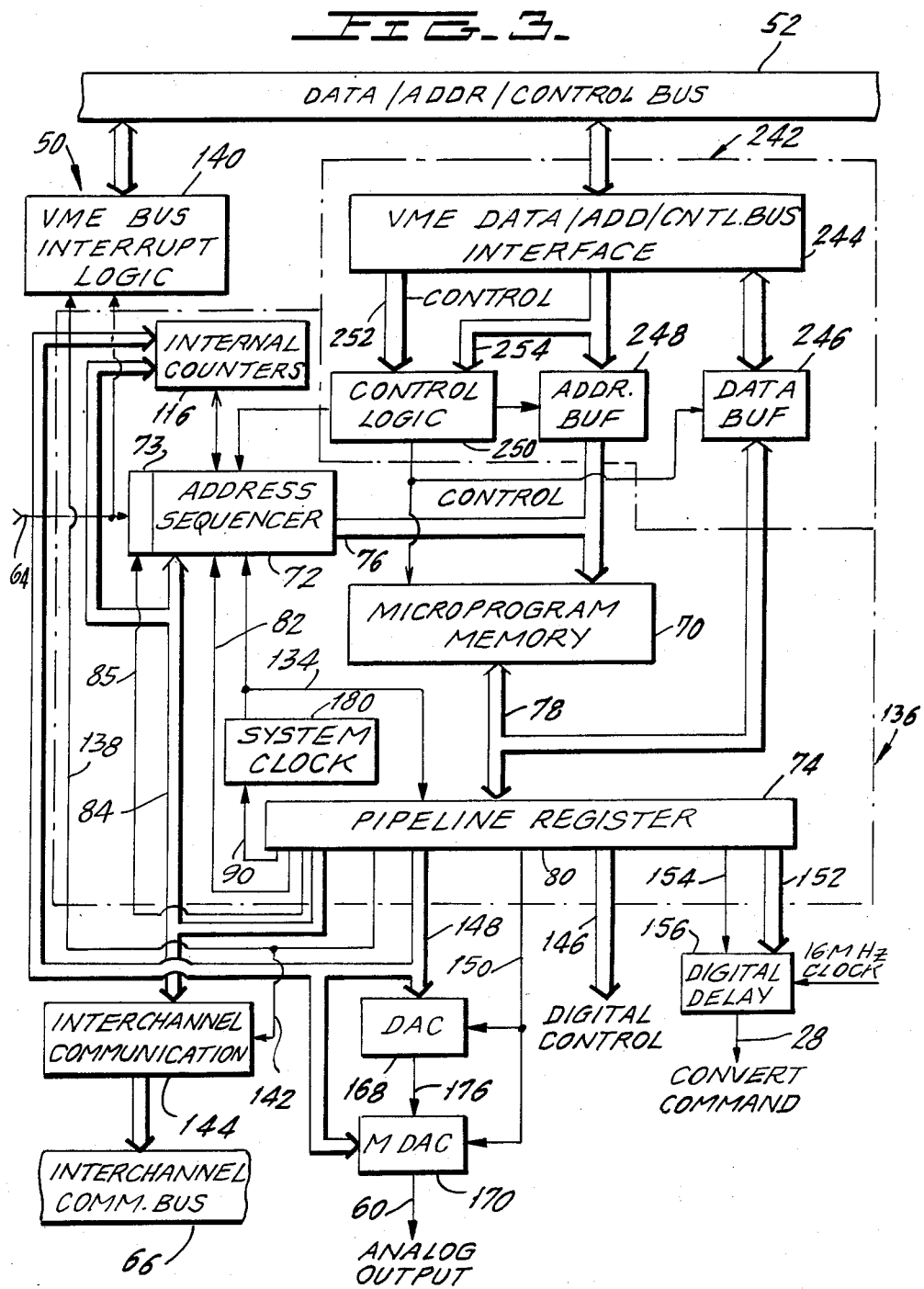

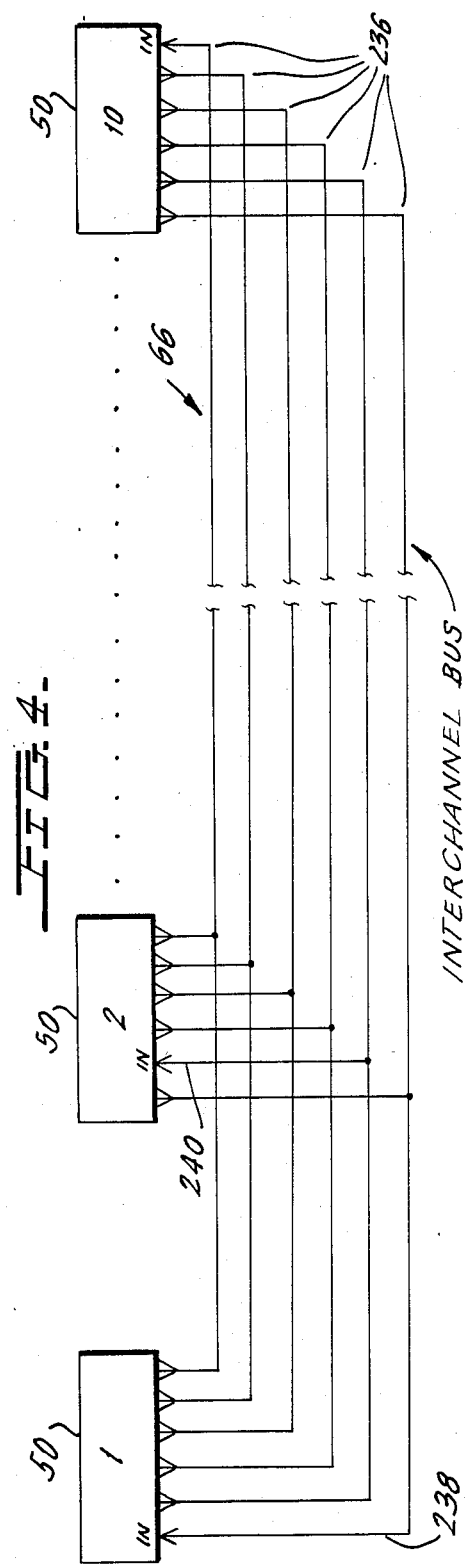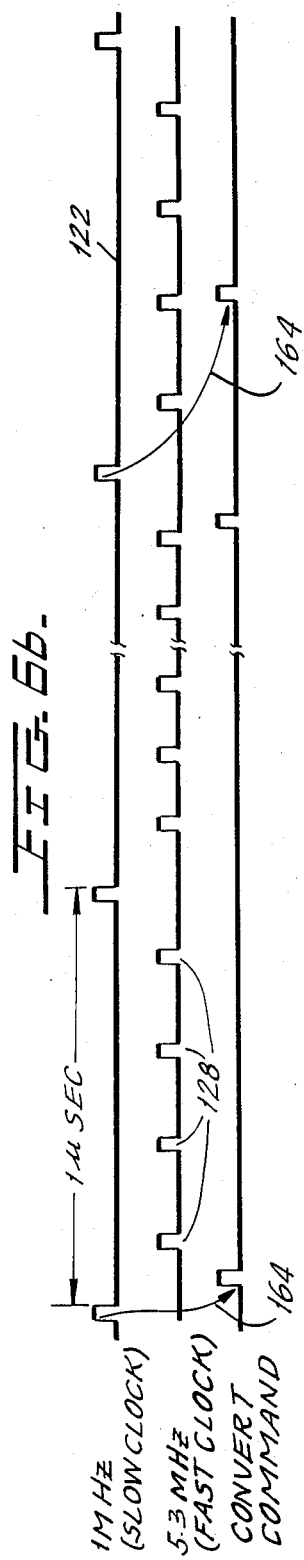

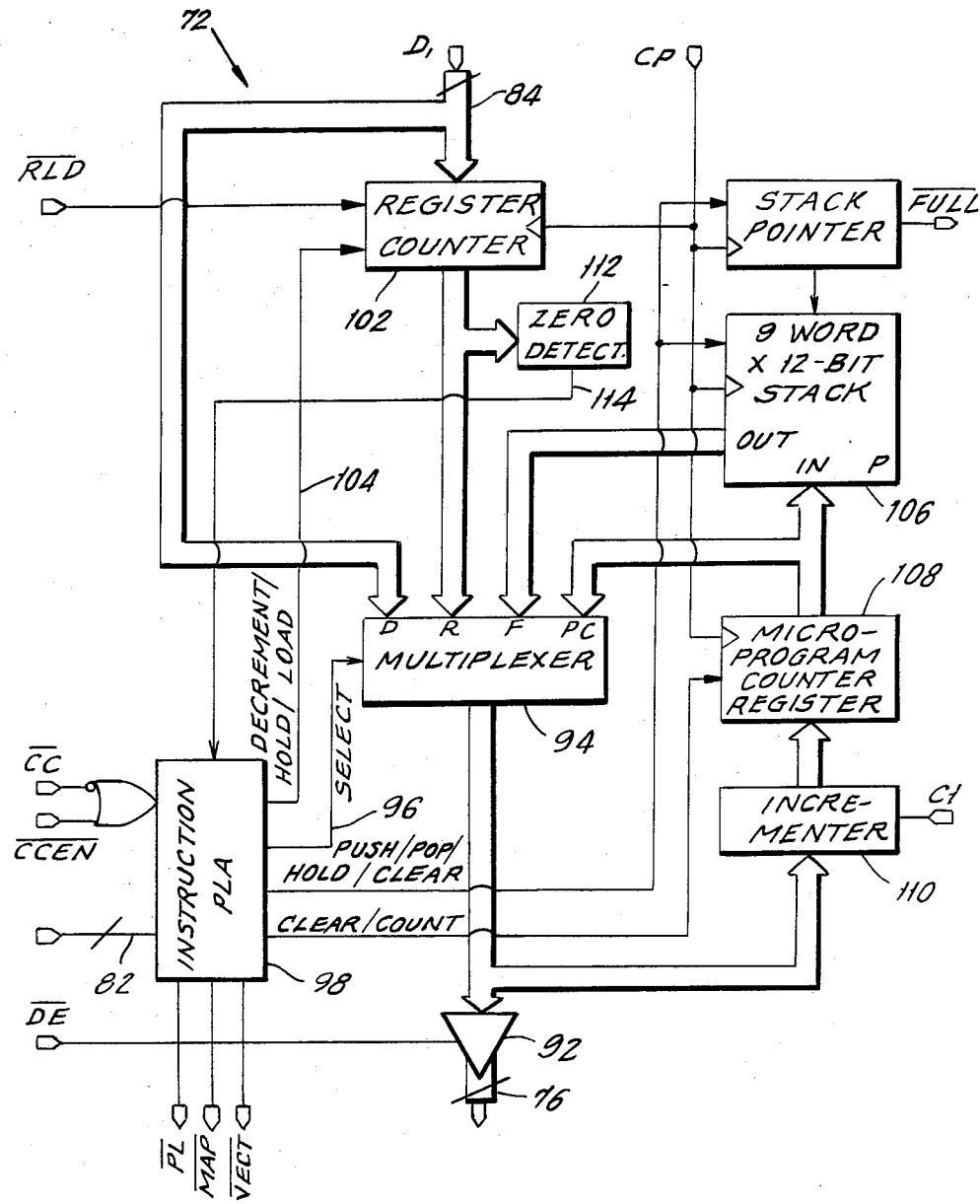
_FIG. 5._ (PRIOR ART)

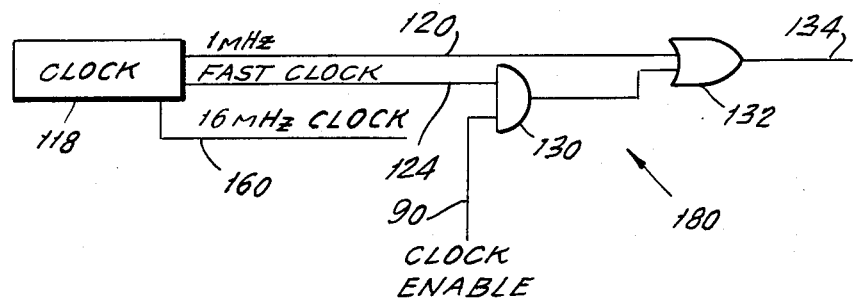
FIG. 6a.
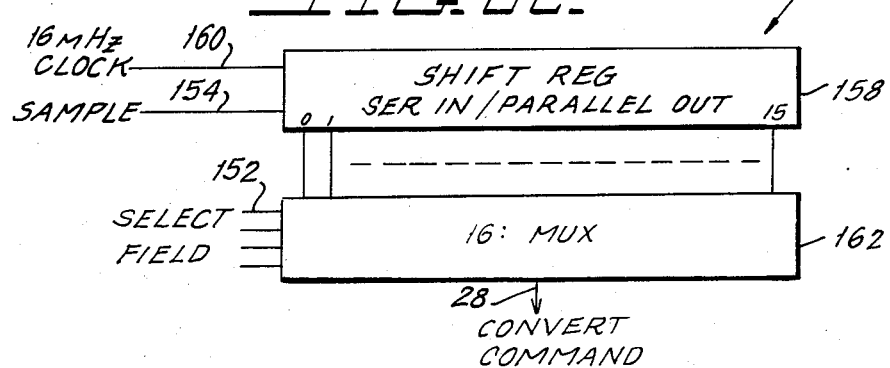
FIG. 6c.
| TIME | DAC FIELD |
|---|---|
| 0 | 00000 |
| 1 | 01000 |
| 2 | ↓ |
| 3 | |
| 4 | |
| 5 | 01010 |
| 6 | 01101 |
| 7 | 01111 |
| 8 | 10001 |
| 9 | 10011 |
| 10 | 10101 |
| 11 | 10111 |
| 12 | 11001 |
| 13 | 11001 |
| 14 | 11010 |
| 15 | 11011 |
| 16 | ↓ |
| 17 | 11100 |
| 18 | ↓ |
| 19 | |
FIG. 9.

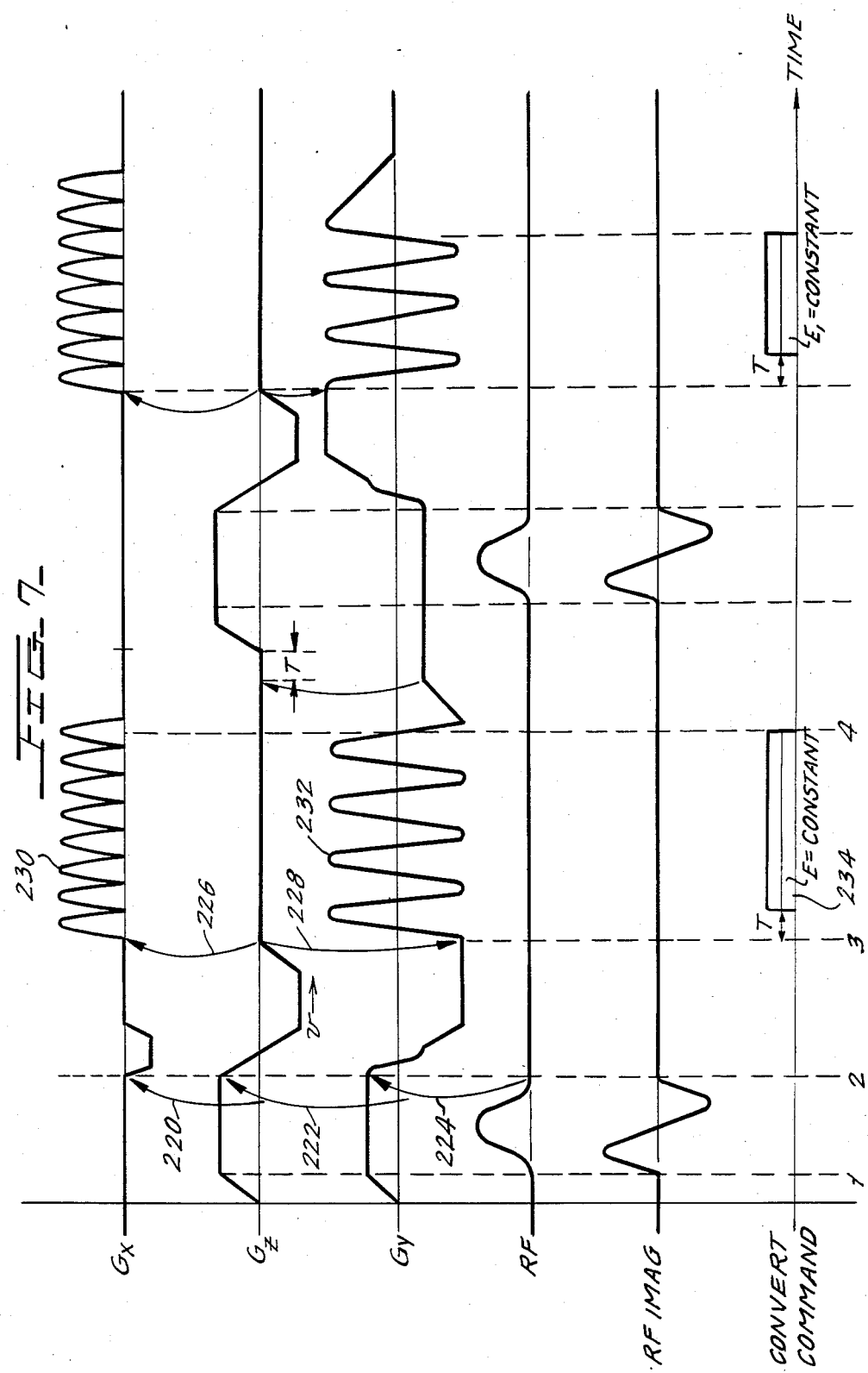

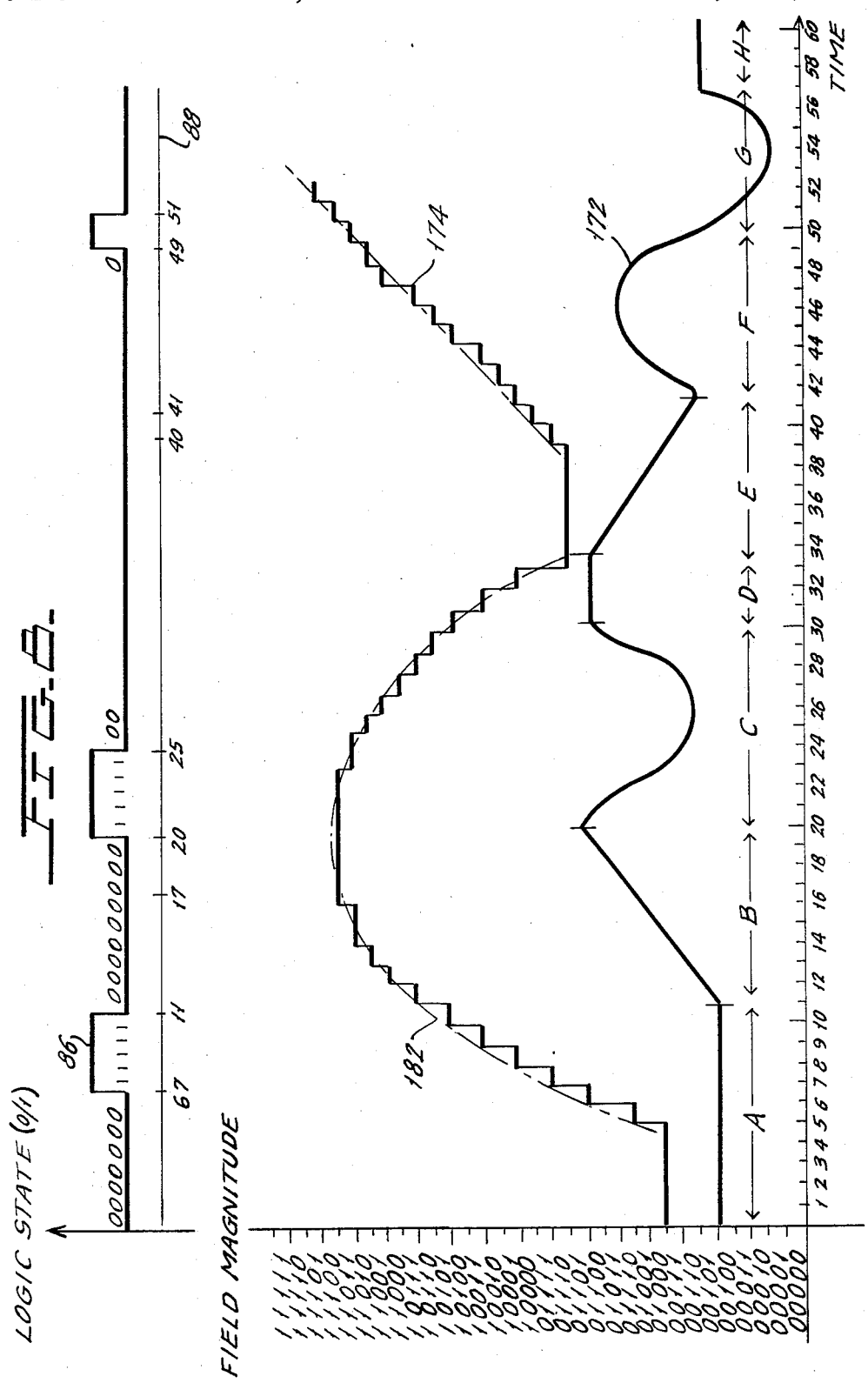

FUNCTION GENERATOR FOR NMR SYSTEM

BACKGROUND OF THE INVENTION

The present invention relates generally to a computerized nuclear magnetic resonance (NMR) imaging system, and more particularly, to a function generator for generating complex analog waveforms used in an NMR imaging system and control signals necessary for its operation.

Nuclear magnetic resonance finds applications in numerous fields. The present invention will, however, be introduced by reference to NMR imaging in medicine. NMR imaging is a powerful tool which can reveal the structure and make-up of internal tissue and organs of a body through a non invasive procedure. The physician is thus provided with information which can be used to identify the nature of the disease that afflicts the internal organ and pinpoint its location.

NMR imaging, very broadly, operates as follows. A patient is subjected to the influence of carefully aligned magnetic fields produced by the NMR imaging system. The fields force nuclei within the body to orient themselves along lines of force associated with the magnetic fields. When the fields are removed, the nuclei relax and their relaxation is accompanied by a characteristic electromagnetic radiation which can reveal the molecular composition of a given tissue. The electromagnetic radiation possesses a spatial distribution and a timing and frequency relationship can be used for imaging the position, shape and composition of selected internal organs or tissue of the patient.

An NMR imaging system, very broadly, includes magnets which surrounds the patient, radio frequency (RF) coils and power drivers which are used for producing magnetic fields in the magnet, a receiver for detecting the patient emitted electromagnetic radiation and for producing electrical signals representative thereof, and a processor for analyzing the data from the receiver and for generating an image from such data.

While the NMR phenomena has been observed as early as 1946, the ability to create images from the spatial distribution of NMR signals was not demonstrated until the early 1970's.

The difficulties associated with constructing an operational NMR imaging system reflects the enormous complexity involved in sensing the rather feable NMR radiation from a patient and using these feable signals to construct a discernable image which can be interpreted by the physician. Another difficulty concerns the generation of complex waveforms for driving the RF coils and power drivers in the magnets to generate precisely controlled and aligned magnetic fields so that the NMR signals from the patients could be properly interpreted.

The present invention is specifically related to a function generator which simplifies the generation of the complex analog waveforms and which provides an increased level of flexibility. With the invention, the scientist or physician can exercise real-time control over the generation of the complex waveforms referred to above. The invention's objective is to provide the function generator of the present invention at a configuration which reduces its size and cost and increases its flexibility over prior art devices.

The principles which determine: the shape and type of magnetic fields required in an NMR imaging system; the nature, characteristics and frequencies of the electromagnetic radiation emitted by the patient; and the basic hardware necessary for sensing and analyzing the NMR signals from the patient have been described in the literature.

For example, the article entitled "Nuclear Magnetic Resonance: Beyond Physical Imaging", by Paul A. Bottomley and published in the February, 1983 issue of IEEE's Spectrum magazine, pages 32-38, describes the basic NMR principles. In FIG. 5, it shows the basic hardware blocks, including a transmitter, receiver, magnet, gradient coils and a computer for analyzing the data. The article by Ian L. Pykett entitled "NMR Imaging in Medicine", appearing in the May, 1982 issue of Scientific American, pages 78-88, similarly provides a description of the basic principles of NMR. The hardware structure of a typical NMR system is further illustrated in an article entitled "Electronics and Instrumentation for NMR Imaging", authored by A. A. Maudsley et al and published in the August, 1984 issue of IEEE transaction on nuclear science, Vol. NS-31, No. 4, pages 990-993. The overall configuration of an NMR imaging system appears in FIG. 1, and shows the basic interconnection between the transmitter, receiver, waveform controller, magnet and the computer which invariably appear in systems of this type. While this article alludes (at the right column of page 990) to the desirability of loading the shape of a waveform from a controller, the flexible, modular and highly compact structure of the waveform generator in accordance with the function generator of the present invention is not shown.

The ability to manipulate, alter and adjust the analog waveforms which drive the RF coils and the gradient power supply coils is important. These waveforms define the resolution of the obtained image and determine the size, location and angular view of the displayed image. The desirability of having maximum flexibility in generating this waveform is therefore readily apparent.

Yet, in known prior art devices, the complex waveforms are generated by dedicated circuits which are designed to deliver waveforms of predetermined characteristics. These dedicated circuits are often under the general supervision of a central controller which can determine when the waveforms are produced but cannot dynamically control the exact and final shape of these waveforms. While in known prior art devices the central controller or computer is capable of selecting a desired analog waveform from a library of such waveforms, the exact shape, timing and frequency of the waveform is not under computer control.

A notable disadvantage of NMR imaging is that the patient's exposure time to the magnetic fields and the ensuing processing period are rather long, i.e. in the order of 1 to 10 minutes. Further, when an image is obtained, it may be evident that the image does not show a desired portion or view of a patient's anatomy. It is thereafter necessary to change the position of the patient within the magnet and/or select a different configuration of RF fields from a fixed set of fields which, in prior art devices, are permanently wired in the dedicated circuits.

Thus, prior art NMR devices are inflexible. They restrict the options available to the diagnostician and cannot be easily refurbished to accommodate advances in the art related to the generation of improved or better defined magnetic fields.

Further, hard-wired, fixed, dedicated circuits present the additional disadvantage that hardware repair or modification is difficult and retrofitting to accommodate advances in the understanding of the NMR phenomena are almost impossible.

The primary objective of the present invention is therefore to provide a function generator for an NMR imaging system which avoids the disadvantages of similar circuits found in prior art devices.

BRIEF SUMMARY OF THE INVENTION

In accordance with the general objective of the present invention, a function generator is provided for generating the complex waveforms used in NMR imaging systems. The function generator includes, in a minimum configuration, a single waveform synthesizer including a memory in which are stored data defining the shape of the waveforms and instructions which control the access to the data. An address sequencer, which need not have ALU capability, produces a sequence of addresses for accessing the data from the memory. Each of many data words in the memory are organized in the form of several fields where each field relates to a different category of data.

One of these fields is the instruction field. The output from the memory defined by the instruction field is coupled back to the address sequencer and controls the generation of next addresses for the memory. The next address may be a completely new address specified by data from the memory, an increment of the previous address or a jump to a subroutine, for example. Other fields are generated which define at least one analog waveform and many digital outputs and control signals.

The term "complex waveform" as used herein refers to a time varying analog signal. Accordingly, the invention includes analog waveform synthesizer means responsive to one or more of the fields from the memory to generate an analog complex waveform of a timing and magnitude characteristic defined by the data fields.

Two primary features of the present invention are first the data entry means which allow the contents of the memory to be dynamically updated or modified from an external source to provide full and dynamic control over the generation of the analog waveform and, second, the program means which provide a unique software data and instruction organization which simplifies the generation of waveforms and reduces the amount of hardware and software necessary for implementing the waveform synthesizer.

The program means include data segments which characterize and define a set of elementary waveform segments. A subroutine structure is used for synthesizing complete waveforms by selectively retrieving data segments and by producing, through a concatenation process, complete composite waveforms. Thus, a limited set of elementary segments in the form of, for example, a ramp, one-half of a sinusoid (180°), a non-linear segment or the like, are sufficient for producing any desired waveform which may be used in an NMR imaging system. Further, even presently unknown waveforms can be later defined with an easily generated data segment.

The invention further includes a novel system clock arrangement having a dual clock frequency. Clock pulses of a first clock, operating at a fixed first frequency, for example, 1 megahertz, are used for synchronizing all events associated with the generation of the analog data fields or the othr fields provided for the digital outputs or control signals.

A second clock of a frequency higher than the first frequency generates a sequence of intermediate clock pulses, preferably 4 or more, which occur during the interval between adjacent clock pulses of the first clock system. The second clock can be controlled so that a given number of intermediate clock pulses appear between adjacent pulses of the first clock. The intermediate pulses are enabled as a group. The group will consist of, for example, 1, 2, 3, etc. adjacent intermediate clock pulses. In another embodiment, the intermediate clock pulses are selectively enablable by data outputted from the memory so that the occurrence or non-occurrence of a given intermediate clock pulse is programmable.

Background program operations associated with initialization steps during transitions from generating one waveform segment to another can be performed in background mode without affecting the execution of program steps involving current segment generation.

In a preferred embodiment, a pipeline register is provided at the output of the memory. The pipeline register stores outputs from the memory for a duration of one clock period to allow the address sequencer to begin the fetching of a next data word while the previous word is maintained. "Pipelining" speeds up the data processing capability of the system and further ensures that the outputs from the memory are never in an indetermined state. While the invention shows the pipeline register as a distinct and separate device from the memory itself, it is to be recognized that advances in memory technology are contemplated where pipeline registers will be included as part of the memory itself.

In a more elaborate function generator, a plurality of synthesizers, as described above, are combined, in a modular fashion, to allow simultaneous generation of a plurality of analog waveforms. A common data/address/control bus interconnects the individual synthesizers to a central controller CPU and, optionally, to other computers. The memory of each synthesizer is loadable through the common bus from either the central controller or from the external computer. With this arrangement, any of the synthesizers, each of which is preferably in the form of a printed circuit board, can be used interchangeably to generate any of the waveforms. Modularity, expansion, reprogrammability and logistics are significantly improved thereby.

The function generator further includes an interchannel communication bus. The interchannel communication bus allows the individual synthesizers to synchronize their operation, without the intervention of a central controller. In this manner, the waveforms from each synthesizer can be staggered or synchronized to one another.

To reduce the hardware and software configuration to a minimum, the invention, in various embodiments, indicates the use of digital to analog converters, multiplying digital to analog converters, programmable array logic devices (PALs) and other integrated circuits for reducing the complexity of the combinatorial logic circuits and for allowing such circuits to be readily reconfigured in the future.

Other features and advantages of the invention will be apparent from the following description of preferred embodiments of the invention considered with reference to the accompanying drawings.

BRIEF DESCRIPTION OF THE DRAWINGS

FIG. 1 is a block diagram of a prior art NMR imaging system.

FIG. 2 is a block diagram of a preferred embodiment of the function generator of FIG. 1 and shows a plurality of synthesizer modules or channels and other peripheral circuits interconnected by a data/address/control bus.

FIG. 3 is a block diagram of one of the plurality of synthesizer channels shown in FIG. 2.

FIG. 4 shows an embodiment for the interchannel communication bus shown in FIG. 2.

FIG. 5 is a block diagram of a prior art address sequencer which may be used for the address sequencer shown in FIG. 3.

FIG. 6a shows a circuit embodiment for the clock system of FIG. 3.

FIG. 6b is a timing diagram which illustrates the operation of the clock system of the present invention.

FIG. 6c shows a circuit embodiment of the digital delay block of FIG. 3.

FIG. 7 shows a plurality of analog waveforms which are used in an NMR imaging system.

FIG. 8 illustrates the generation of an analog waveform and digital outputs in accordance with the present invention.

FIG. 9 is a table that lists a partial sequence of data words which are issued for generating the analog waveform shown in FIG. 8.

DETAILED DESCRIPTION OF THE DRAWINGS

Figure 10:
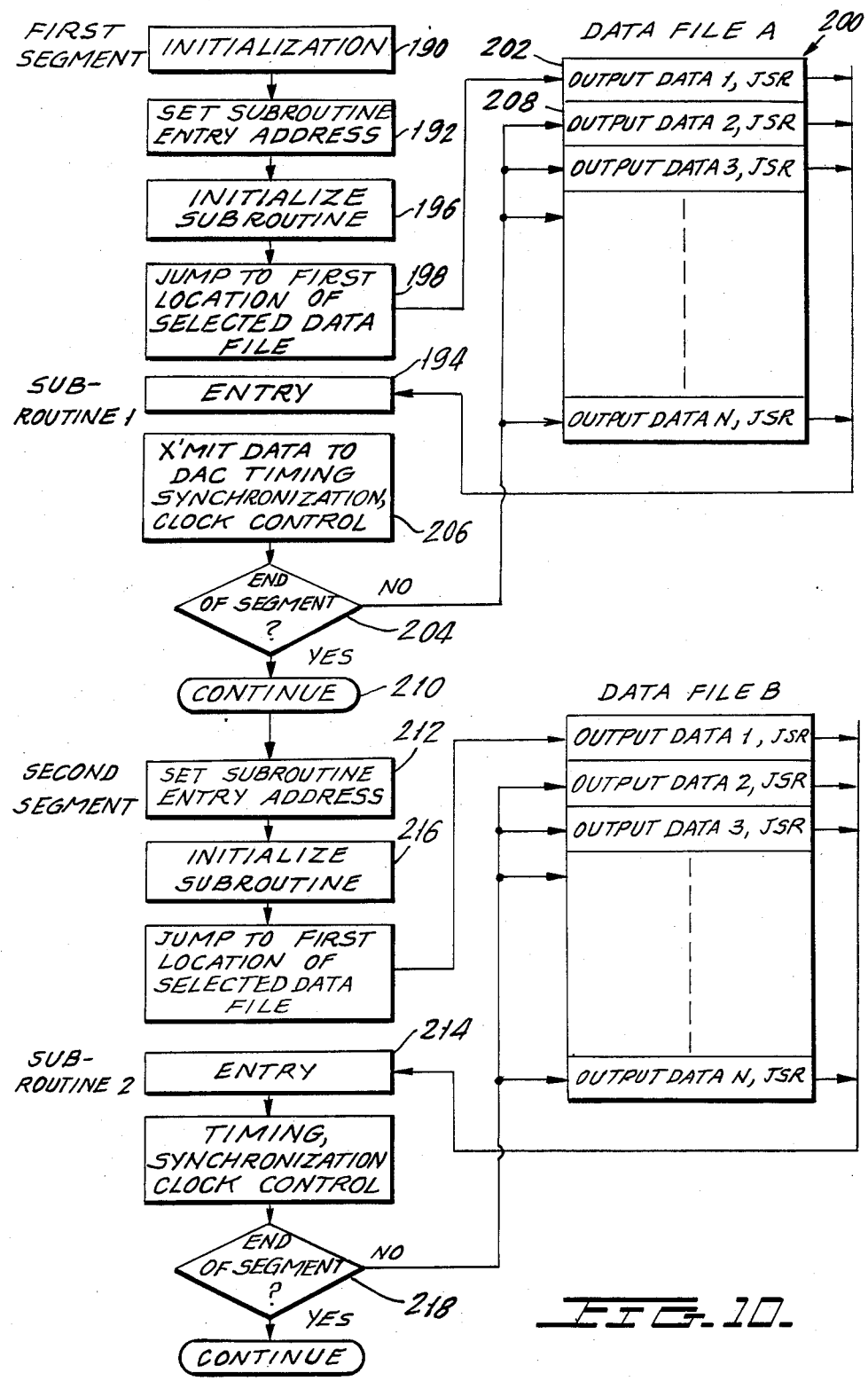
FIG. 10 shows a software flow chart which is presented for explaining the software organization and approach in accordance with the present invention.

Referring now to the drawings wherein like numerals indicate like elements, there is shown in FIG. 1 an overall block diagram of an NMR imaging system designated generally as 10. The heart of the present invention is the novel NMR function generator 12 which is to be later described and which serves to generate various waveforms and control signals which are used by the remaining subsystems of the NMR imaging system 10.

A.

THE IMAGING SYSTEM

The NMR imaging system 10 includes a magnet 14 of a size and shape that allows it to surround a patient 16. In the magnet 14 are arranged a plurality of coils (not shown) which are energized by external signals to generate magnetic fields which surround the patient 16. The magnetic fields have a spatial distribution and timing and frequency relationship which induces the patient's body to emit NMR signals in accordance with the well-known NMR principles as described in the literature. There are ordinarily three coils (not shown) for producing three-dimensional magnetic fields. The coils are referred to, respectively, as the X, Y and Z coils.

The magnet 14 operates in conjunction with a plurality of subsystems. The subsystems interface with the magnet and provide means for generating the signals which drive the magnetic coils and circuits for detecting NMR signals which are emitted from the patient's body. A subsystem 32 for monitoring physiological state of the patient 16 is also provided.

These subsystems include a field gradient driver block 18 which buffers and amplifies analog waveforms which drive the coils and which are received from the function generator 12. An RF transmitter subsystem 20 is interfaced to the magnet 14 and provides RF modulation for modulating the magnetic fields to enable the separation of the NMR signals from other signals which are present in and around the patient 16. The RF transmitter 20 is also controlled by the function generator 12.

The receiver 22 includes transducers for sensing the electromagnetic NMR signals which emanate from the patient 16. The receiver 22 demodulates the electromagnetic signals to provide pure NMR signals in the form of an analog waveform of the general characteristic of, for example, the waveform shown at FIG. 3 of the article "Nuclear Magnetic Resonance: Beyond Physical Imaging" referred to above. The receiver also includes preamplifier circuits (not shown) which amplify the feable NMR signals.

The NMR signals are analyzed in accordance with well-known principles to derive from it information which is converted to an image that can be understood and interpreted by a diagnostician. The most powerful analysis tools employ digital processing techniques and, therefore, the NMR signals must be converted to digital form. Accordingly, an a/d converter 24 receives the analog NMR signals from the receiver 22 and converts it a stream of digital words which can be used by a data processing computer 26. To obtain all the information from the NMR signal, the a/d converter 24 must sample the NMR signals at a frequency which is sufficiently high in accordance with the well-known Shannon theorm. Optimum processing also requires that the data words received from the a/d converter 24 should be correlated in time to the generation of the magnetic fields or indirectly to the analog waveforms which are produced in the function generator 12. The generation of the magnetic fields must be further controlled to obtain a timing synchronization between the magnetic fields and a predetermined physiological state of the patient. For example, it may be useful to image the heart during its systolic phase or at any other time during the heart cycle. The physiological monitors 32 produce an output 34 which indicate the physiological state of the patient 16.

The overall coordination of events in the imaging system 10 is provided through the function generator 12. The function generator 12 controls the timing of the various signals which drive the field gradient drivers 18 and the transmitter 20 in synchronism with the physiological state of the patient 16. It also provides control signals 28 for controlling the sample rate and timing of the a/d converter 24 to ensure that the digital output data 30 from the a/d converter 24 data can be properly analyzed.

The process of generating an image with the imaging system 10 will now be described. The NMR function generator 12 receives physiological inputs from the physiological monitors 32. At a predefined instant in relation to the patient's physiological status, a first set of waveforms for driving the field gradient drivers 18 and the transmitter 20 are produced at outputs 36 and 38, respectively. After a known time delay, the patient's body responds by generating the NMR signal 40. When the NMR signals become active, the NMR function generator 12 produces a convert command signal 28 in the form of a sequence of pulses of a sufficiently high frequency. Each of these pulses commands the a/d converter 24 to sample the analog NMR signals to produce a digital data word which corresponds to the magnitude of the NMR signal at a given point in time.

The data from the a/d converter 24 is transmitted through outputs 30 to a data processing computer 26. The data is stored on a data storage medium, for example a data storage disk 42, as shown in FIG. 1. When a sufficient quantity of data has been collected, the data is retrieved from the disk 42 and manipulated and analyzed by well-known methods such as fast Fourier Transforms to produce a visible image. Owing to the extremely large numerical calculations which are involved in analysis of this sort, an array processor 44 may be used as a "numbers cruncher" for speeding up the analysis or for providing a real time images of a moving organ such as the human heart. After an image is synthesized, the information defining the image is transferred to a display 46 which may include a television or similar display device whereby the image can be perceived by the human eye.

The data processing computer 26 communicates with the NMR function generator 12 over a bus 48. The bus 48 allows the data processing computer 26 to gain access to the internal memory of the function generator or to its central controller, as will be described. This enables the computer to analyze different cross-sections within a patient's body in response to operator controls or internally generated commands. The design details of the various subsystems described so far, with the exception of the NMR function generator, have been described in the literature referred to previously and are well-known to persons skilled in the art of NMR imaging. Additionally, it should be observed that while the block diagram of FIG. 1 indicates certain well-defined subsystems, various designers may choose to break up the imaging system along subsystem blocks which may encompass more or less than the blocks shown in FIG. 1.

The focus of the invention, as previously stated, is a novel circuit for an NMR function generator 12. The invention also indicates significant advantages of using an NMR function generator 12 in conjunction with the overall imaging system shown of FIG. 1.

B.

THE FUNCTION GENERATOR

FIGS. 2 through 7 illustrates various design features of the NMR function generator 12 shown in FIG. 1. Referring first to FIG. 2, the function generator 12, there illustrated, includes a plurality of synthesizer modules 50 in the form of discreet printed circuit boards which are interconnected by a common data/address-/control bus 52.

The function generator 12 is designed around the concept of a common bus. The common bus 52 is used for interconnecting a plurality of discreet circuits or modules such as the modules 50, 54, 56 and 58. Each module comprises identical circuits through which it is interfaced to the common bus 52. A predefined protocol establishes the order and sequence for data exchange between the modules. The bus interconnect structure provides a design approach which simplifies the task of interconnecting a plurality of modules and facilitate the steps of debugging or repairing the hardware.

Standard bus interconnect schemes and communication protocols are available in the industry. Accordingly, to simplify design and increase the serviceability of the function generator 12, a standard bus system is used.

Analysis has shown that the well-known VME bus is particularly suitable for use with the present invention. The VME bus structure and protocol is described, for example, in the VME bus specification manual, revision B August, 1982, published by the MOSTEK division of United Technologies.

It is an important aspect of the present invention that standard off-the-shelf components are used wherever possible to reduce the design cost factor and improve serviceability. Accordingly, the printed circuit boards shown in FIG. 2 are divided into two groups. A first group includes off-the-shelf standard modules which operate with the VME bus and which are available from a variety of suppliers. These include the host interface 58, the central controller CPU 56, and the global memory 54.

The synthesizer modules 50 belong to the second group. The function generator 12 is interfaced to the subsystems of the NMR imaging system 10 through the second group of modules 50. As seen in FIG. 2, the VME bus can accommodate a plurality of synthesizers 50. The only limitation being the number of slots for inserting pc boards in a cage (not shown) which houses the VME bus 52. For example, as illustrated in FIG. 2, the function generator accommodates ten synthesizer modules 50.

Each of the synthesizers 50 produces one analog output 60, a plurality of digital outputs 62, and can receive control signals in the form of digital inputs 64 as will be described. The synthesizer boards 50 are identical to one another hardwarewise. However, their respective analog and digital outputs are different and depend on the software which is loaded into each module to define the waveshape of the outputs and the function performed by a given synthesizer. The central controller 56 can identify or address a synthesizer module 50 by its physical location on the bus or by a unique address defined by a set of switches on each synthesizer module 50.

The synthesizer modules 50 may signal each other through the interchannel communication bus 66. The interchannel communication bus 66 is not a data transfer bus but rather a signaling bus which allows the synthesizers 50 to indicate their status to other synthesizers. Thus, the various synthesizers 50 may synchronize their operations, as will be described.

FIG. 2 can be related to FIG. 1 as follows. The outputs 60 and 62 of the individual synthesizers 50 correspond to the outputs 38 and 36 which control the transmitter 20 and the field gradient drivers 18. The convert command signal 28 which drives the a/d converter 24 is one of the digital outputs 62 of FIG. 2. The digital inputs 64 allow one or more of the synthesizers 50 of FIG. 2 to receive the physiological monitor signals 34 shown in FIG. 1. The function generator interfaces to the data processing computer 26 through the host interface module 58 shown in FIG. 2 and through the external data processing bus 48.

The standard modules of the first group include the following modules which are available from several vendors. The modules are available from Motorola, Computer Products, Inc. or Ironics and are described in Ironics, Inc.'s VME bus productivity Series Specification, published Mar. 15, 1984, Computer Products, Inc.'s Engineering Technical Specification for Parallel DMA Interface (Part No. AEO21-5260), and in the Motorola Reports November, 1984 issue. For example, the central controller CPU 56 is an IV-1600 system foundation module. The module provides local control over the individual synthesizers and is based on a 68010 microprocessor and a program with real time multitasking software. The module 56 also includes 256 kilobytes of high-speed dual port RAM as well as 160 kilobytes of PROM. The central controller 56 also includes three programmable countertimers which are interrupt driven to provide a time base for NMR applications as well as crystal-controlled clock/calendar function for generating alarm interrupts at preselected times during each day.

The global memory 54 is an IV-1611 module which provides expanded memory to the central controller 56. The global memory 54 can accommodate up to 2 megabytes of dynamic RAM. The host interface 58 is the above-noted parallel interface DMA module available from Computer Products, Inc. The function of the host interface 58 is to allow the central processing computer 26 shown in FIG. 1 to interface to the VME bus 52 through the host interface 58. In this manner, the data processing computer 26 has access and can communicate to both the central controller 56 or to any of the other modules which are accessible through the VME data/address/control bus 52.

The actual synthesis of the various waveforms and control of the subsystems of the imaging system is carried out by the synthesizer modules 50. The synthesizer modules 50 operate generally independently of but are under the general supervision and control of the central controller 56. Because the synthesizer modules 50 possess a common structure and organization, the operation and structure of one typical synthesizer module is described below.

C.

THE SYNTHESIZER MODULE

The Microprogram Controller

FIG. 3 illustrates the hardware configuration of one of the synthesizer modules 50 shown in FIG. 2. The heart of the synthesizer 50 is a microprogrammable controller 136 designed to generate an analog and a plurality of digital outputs having respective waveforms and timing relationships which are defined in a microprogram memory 70. A microprogrammable controller operates in a computer-like manner but is not a computer in the sense that it cannot be used for general purpose tasks. Rather, it is a firmware designed and constructed for specific, limited purposes. Nevertheless, the selection of a microprogrammable controller for generating actual timing waveforms affords a level of flexibility which cannot be matched by hardwired circuits.

The controller 136 includes the address sequencer 72, the data input multiplexer 73, the microprogram memory 70, and the pipeline register 74. The address sequencer 72 is a controller which is able to produce a sequence of outputs in accordance with a limited set of instructions. Advanced Micro Devices' (AMD) AM29-10A microprogram controller, operating in conjunction with a 2923 data input multiplexer 73, is particularly adapted for use as the address sequencer 72 of the present invention. It includes a data port 76, 12 bit wide, which herein provides addresses for the microprogram memory 70.

The microprogram memory 70 includes 4,096 memory locations with 64 bit wide data words. The memory 70 can comprise, for example 16 2k×8 2016 dynamic RAMs. The 12 bit address from the address sequencer 72 is communicated to the microprogram memory 70. In response, the memory delivers at its output 78 a data word consisting of 64 bits of data stored at that location. The microprogram memory data is transmitted to a pipeline register 74. The pipeline register 74 consists of a 64 bit wide register which receives and stores one data word at any given time. The 64 bits which appear at the output side 80 of the pipeline register 74 are divided into several fields as will be described herein.

An address sequencer instruction field 82 includes 4 bits which are fed back to the address sequencer 72. A general purpose data field 84 consisting of 12 bits of data is also provided to the address sequencer 72. The 4 bit instruction field 82 instructs the address sequencer 72 to perform one of 16 functions which control how the next address will be generated. For example, it is possible that the instruction merely commands the address sequencer to increment the previous address value. Thus, the address provided to the memory 70 will be an address which will fetch the data word which follows the previous data word. On the other hand, it may be necessary to process the data out of sequence. Then the instruction field 82 can direct the address sequencer 72 to output a next address which is defined by the value of the general purpose field 84. Thus, a jump instruction can be implemented. A more detailed description of the jump options available with the microprogram controller 136 will be provided in connection with the description of the address sequencer 72 which appears later herein.

Of importance is that with the address sequencer 72, data input MUX 73, memory 70, and pipeline register 74, it is possible to define a path through the microprogram memory and that the path is defined by the data in the memory. With this in mind, the manner of generating waveforms can be now understood. It has been noted above, that the 4 bits of the instruction field together with the 12 bits of the general purpose field are necessary for controlling the address sequencer 72. It will be shown later that 4 additional bits are used for controlling the data input MUX 73. These 20 bits, together, are sufficient for fully defining a path through the microprogram memory 70. However, the memory 70 and pipeline register 74 are 64 bits wide so that there remain 44 bits at each memory location whose logic state, at any given memory location, can be set to any desired value. These 44 bits are defined at each memory location to have a high or a low logic level so that as the path through the memory 70 is traversed, each of the 44 bits or lines produces a sequence of ones and zeros which define a waveform. The logic level of these 44 outputs is defined at any instant by the contents of the memory data retrieved at that instant. Since, as will be described, the contents of the memory can be changed, it follows that the actual waveform at any of the 44 available output lines can be easily modified.

This can be further understood by reference to FIG. 8. In the upper section of FIG. 8 a digital waveform 86 is shown. The abcissa 88 is graduated in numbers which designate an address or a time value. Let us assume that the address sequencer generates a sequence of addresses from 0 to 50 (no jumps). Let it be further assumed that the waveform 86 of FIG. 8 corresponds to the clock enable output 90 shown in FIG. 3 and that the output 90 occupies the 20th bit position of the 64 bits belonging to one data word. Then, if the microprogram memory contains in its 20th bit position between the addresses 0 to 50 a sequence of ones and zeros as shown, the waveform 86 results. For example, if the sequence is 000000111110000000011111, etc., the clock enable output 90 in FIG. 3 assumes the shape of the waveform 86 shown in FIG. 8.

Let it be now assumed that a time period of one microsecond elapses between the outputting of each data word. Then the waveform 86 in FIG. 8 has a low level for a time period of 7 microseconds, followed by a high level for a time period of 5 microseconds and again a low level for a period of 9 microseconds and so on. Thus, the shape of the digital signal is fully definable by a sequence of ones and zeros programmed in the microprogram memory 70.

Accordingly, 44 distinct waveforms (64 bits less the 20 bits necessary for controlling the address sequencer) can be easily generated in this manner. Further, it is possible to group several of these outputs to perform specific functions just as the grouping of four lines yields the instruction field 82.

Not only is the above configuration powerful in that a mere handful of integrated circuits is capable of generating as many as 44 independently definable timing waveforms, but further this design is significant in that it allows the user to define the actual waveform after the hardware has been built. Another important feature is that the microprogram memory consists of read-/write memory chips (RAM). It is possible to completely alter the sequence of addresses and/or the definition of the various outputs during different periods of times, as will be described later herein.

The Address Sequencer

The address sequencer 72, according to the present invention, will now be described in greater detail. A typical address sequencer such as the AM2910A microprogram controller is shown in FIG. 5. The addresses for the microprogram memory 70 are provided from tristate buffer 92 and through the data bus 76 (FIGS. 3 and 5). Multiplexer 94 is the source for the addresses which appear at the data bus 76. The multiplexer 94 can select one of four inputs D, R, F, or PC as an address source. The actual address which appears at the output 76 is determined by select line 96 whose logical state is controlled by the instruction PLA 98. Inputs 82 of the instruction PLA 98 receive the instruction field 82 shown in FIG. 3. The 4 bit instruction field determines the instruction that is performed within the address sequencer 72. The D, R, F and PC address sources provide four options in generating a next address as follows. The D input of the multiplexer 94 receives the addresses from the data input 84 of the address sequencer 72. The data input 84 corresponds to the general purpose data field 84 shown in FIG. 3. Accordingly, a next address can be set to a value which is stored in the microprogram memory 70 of the synthesizer 50. A second address choice is an address value received from the register counter 102 at inputs R of the multiplexer 94. The register counter 102 can be used for accessing a block of data within memory 70. Namely, a value from the microprogram memory 70 appearing at the input lines 84 can be stored in the register counter. The value in the counter 102 can be decremented respectively through activation of control line 104 supplied by instruction PLA 98 to access a block of data.

Another source for addresses is through the input F of the multiplexer 94. This address is received from a stack register 106 which is able to holds 9 data words, each 12 bits wide. The addresses generated by the stack register 106 are designed for executing subroutine jumps or other similar operations. The microprogram counter register 108 provides a fourth source of addresses at input PC of multiplexer 94. The microprogram counter register is coupled to the incrementer 110 which allows the microprogram counter register to provide a naturally increasing sequence of addresses. The microprogram counter register 108 is used most often as an address source because ordinarily consecutively located memory data is retrieved from the memory.

The instruction PLA 98 also receives the inputs $\overline{CC}$ and $\overline{CCEN}$. The instruction PLA 98 is adapted to sense the status of these inputs and provides a capability to perform given functions in accordance with their logical state. This feature provides synchronization capability and result oriented response in the address sequencer. The AM2910A is described in greater detail in Advanced Micro Services' data specification for the above device. The data specification is dated December, 1983 and may be obtained by ordering part No. 04522A.

In a preferred embodiment of the invention, the above-noted $\overline{CCEN}$ input of the instruction PLA 98 is connected to a control bit from the pipeline register 74. The $\overline{CC}$ input is connected to an output of the data input multiplexer 73 which has an input for receiving up to 8 input lines 64 and route one of the lines to the address sequencer 72. Which of the input lines 64 is routed to the $\overline{CC}$ is determined by 3 bits supplied by the pipeline register 74. The 3 bits for controlling the data input multiplexer 73 and the 1 bit which is connected to the $\overline{CCEN}$ input are shown collectively as the lines 85 in FIG. 3.

The $\overline{CC}$ is a condition code bit which, when at a low logic level, indicates a "pass" condition. The $\overline{CCEN}$ is an enable line for the $\overline{CC}$ input. Some of the inputs to the data input multiplexer 73 are supplied from the counters 116. This provides a means for producing time delays as described below.

The address sequencer 72 also provides the option of generating a constant address at the output 76 over several clock periods. The instruction PLA 98, in response to an appropriate instruction from the microprogram memory 70, can provide this function by operating in conjunction with the zero detect circuit 112 and the register counter 102. The zero detect circuit 112 receives as an input the contents of the register counter 102 and provide an output 114 whenever the contents of the register counter 102 reach a value of zero. Accordingly, it is possible to load the register counter 102 with a predetermined value and successively activate the control line 104 until its contents reach a value of zero. This condition will be detected by the zero detect circuit 112 and communicated to the instruction PLA 98 by means of the output 114 of the zero detector 112. This feature provides the capability of accessing the same memory location in the memory 70 and maintaining the logic state of the pipeline register 74 constant over many clock periods. Time delays, as described above, can also be obtained by monitoring, in the address sequencer 72, the $\overline{CC}$ input and controlling the data input multiplexer 73 to pass to the $\overline{CC}$ line information from the counters 116.

The above features significantly increases the power of the microprogram controller and overcomes the following problem. If it is assumed that the address sequencer 72 operates with a clock frequency of 1 megahertz (1 microsecond per clock period) and if the size of the microprogram memory is 4,096 data words, it seems that the address sequencer can access every memory location in a time period of 4.096 milliseconds. Although it seems as if the longest definable waveform or digital sequence is limited to 4.096 milliseconds, this is not the case with the present invention.

As described above, the address sequencer 72 is able to dwell for a programmable time at any one memory location. Therefore, if, for example, it is necessary to generate the digital waveform 86 shown in FIG. 8, the required number of memory locations for producing the shown waveform can be related more to the number of logic level transitions than to the actual time periods, i.e. the number of clock pulses, which occur during the definable period of the waveform 86.

The register counter 102 in combination with the zero detector 112 is an important feature. To enhance this capability, the invention provides for additional interval counters 116 located externally to the address sequencer 72 as shown in FIG. 3. These additional interval counters 116 allow the address sequencer to, simultaneously, time several events or increase the total dwell time at a few looping memory locations.

The System Clock

The rate at which addresses are generated in a microprogram controller is determined by the clock frequency generated by the system clock 180 (FIGS. 3 and 6a). The system clock of the present invention employs a unique system clock configuration. A clock source 118 produces a first output 120 having a 1 megahertz frequency and corresponding to the waveform 122 shown in FIG. 6b. A second output 124, designated as fast clock in FIG. 6b, has a clock frequency greater than 1 megahertz and intermediate clock pulses 128 (FIG. 6b) which occur in a time slot between adjacent clock pulses of the first clock output 122. Further, 1, 2 or 3, etc. sequentially occurring intermediate clock pulses 128 can be enabled by the clock enable output 90 provided from the pipeline register 74. The gated intermediate clock pulses are provided from the output of gate 130. OR gate 132 delivers at clock output 134 (see also FIG. 3) the system clock.

The intermediate clock pulses 128 in FIG. 6b, are enabled for carrying out additional control instructions, such as initialization and various data manipulations within the memory 70 when, for example, it is necessary to switch from executing one program sequence to another. Consequently, the address sequencer 72 is capable of operation in two modes. In a first foreground mode, events are generated during occurence of the basic 1 megahertz clock pulses and in a second, background mode, intermediate clock pulses are enabled to carry out background program steps.

The interval between adjacent clock pulses must be sufficiently large to allow the following functions to be performed in the interim therebetween. A first delay is generated before the an address can be produced by the address sequencer 72 and then a finite time elapses until the data can be retrieved from the memory 70. Also, the pipeline register requires the memory data to be present at its inputs at a predefined time before the occurrence of a next clock pulse. The sum of the two delay periods and the "set-up" time of the pipeline register 80 determines the fastest clock speed at which the microprogrammable controller 136 can operate.

. The microprogrammable controller 136, of the present invention, has been tailored to operate at clock speeds of at least 5.3 megahertz. Therefore, the total delay between adjacent clock pulses of the faster intermediate clock described above need not be greater than 188 nanoseconds and, if a worse case scenario is ignored, the clock can be as fast as 10 megahertz or a clock period of 100 nanoseconds.

The Data Entry Means

The contents of the memory 70 can be examined or altered through the VME bus 52 by means of data entry means 242 (FIG. 3).

The data entry means 242 include a VME bus interface 244 for buffering the inputs and outputs of the synchronizer 50 from the data/address/control bus 52. Data buffer 246 is connected between the VME interface 244 and the data output port 78 of the memory 70. Address buffer 248 is tristatable and provides a second address source for the memory 70. The address from the address buffer 248 and from the address sequencer 72 are connected in parallel.

Control logic 250 receives control signals 252 and address information 254 from VME interface 244 and provides control outputs which arbitrate and determine when the memory 70 is under address sequencer 72 control. At other times, the memory 70 is accessible through the bus 52.

VME bus compatibility and hardware reduction goals result in a data buffer 246 of 16 parallel bits. In contrast, the memory 70 is organized to have data words of 64 bits. Therefore, each data bit from the data buffer 246 is connected to 4 output bits of the memory 70. To avoid data collisions, the memory 70 is subdivided into four groups and the control logic 250 is used for generating control lines which enable, through "chip select" control, only one memory group at any given time. The control logic 250 uses programmable array logic (PAL) integrated circuits to reduce hardware and to provide the ability to define or change the characteristics of each output of the control logic after the circuit configuration has been designed or even constructed.

PALs are available, for example, from Monolithic Memories Incorporated (MMI). PAL components, such as 18L4, 16R4 and others are used in the control logic 250. The features, function and use of PALs is described in data sheets available from MMI.

A PAL is an array of AND gates followed by an array of OR gates. A plurality of inputs, as many as 18, are wired to each of the AND gates. The output of each of the AND gates is prewired, in turn, to all the inputs of the OR gates.

A PAL allows the user to open, by means of a programming device, any of the initially defined circuit paths in the PAL. It is possible, therefore, to realize with a PAL exceedingly complex functions which would otherwise require many discreet ICs to obtain similar outputs.

For example, in an 18L4 PAL, four distinct outputs can be defined in terms of 18 inputs all in one single integrated circuit. If the inputs are represented as the letters A, B, C, . . . R, any of the four outputs can be a sum of products of the inputs A-R. The only limitation is that the number of gates available in the AND gate array is at least as large as the number of products in the sum of products. PALs are more fully described in the PAL data book which is published and available from NMI.

With PALs, the exact shape of a hardwire output can be changed at any time by programming a new PAL device and substituting the PAL for an existing PAL in the function generator.

The PALs of the control logic 250 thus provide the flexibility and the means for producing many control lines for controlling the internal circuits of the synthesizer 50.

The Pipeline Register Outputs

Having thus described the heart of the synthesizer consisting of the microprogrammable controller 136, various outputs from the pipeline register 74 which generate the analog and digital outputs will be described next. Referring to FIG. 3, the clock enable output 90 controls the gate 130 (FIG. 6a) and selectively enables intermediate clock pulses.

Control output 138 controls the VME bus interrupt logic 140, to be described, and output 142 is a strobe which loads the contents of the general data bus 84 into the interchannel communication buffer 144, also to be described. The group of digital control lines 146 includes control signals for general use within the synthesizer 50. For example, controls for storing data into the interval counters 116 from the general data field 84 or digital control lines for controlling the subsystems such as the transmitter 20, receiver 22 or drivers 18 shown in FIG. 1. Other outputs are the analog data field 148, the DAC strobe 150, the digital delay field 152 and the sample output 154. These outputs will be described below.

The interrupt control output 138 is supplied to the VME bus interrupt logic 140. Also received by the interrupt logic 140 are the digital inputs 64. The inputs 64 are gated with the control output 138 whereby a given digital input can be enabled onto the bus 52 in order to interrupt the central controller CPU 56. Thus, selected digital inputs can be transferred to the central CPU in accordance with the requirements associated with a given task performed by any of the sequencers 50.

The Digitally Delayed Output

The convert command output 28 provides a series of pulses to the a/d converter 24 of FIG. 1. Each pulse is a command to sample the NMR signal and provides one digital word indicating the magnitude of the NMR signal at that instant of time. It was previously noted that a timing of the convert command signal 28 with respect to the other events in the imaging system is crucial.

Generally, the outputs of the pipeline register 74 are synchronized to the 1 megahertz clock 122 of FIG. 6b. Implicitly, therefore, the timing resolution of the outputs from the pipeline register is limited to 1 microsecond. This resolution is unsatisfactory for generating the convert command signal 28.

The digital delay 156 provides means for delaying the sample output 154 (FIGS. 3 and 6c) by increments of 62.5 nanoseconds (derived from a 16 megahertz clock 160) and to thus provide more accurate timing control over the generation of the convert command signal 28. A circuit embodiment of the digital delay 156 appears in FIG. 6c.

The digital delay 156 includes a serial in/parallel out shift register 158 which receives the sample output 154 and the 16 megahertz clock 160. The sample output 154 reappears at the 16 outputs of the shift register 158 after a time delay which ranges from 62.5 nanoseconds to a full 1 microsecond. The outputs from the shift register 158 are received by a 16:1 multiplexer 162 which is responsive to the digital delay field 152 generated by the pipeline register 74. The field 152 determines which of the 16 outputs from the shift register 158 will be coupled to the multiplexer output 28. The output of the multiplexer 162 is the convert command output 28 which has been selectively delayed with respect to the clock pulses of the 1 megahertz clock output 122. The convert command output is shown in FIG. 6b where arrows 164 indicate that the convert command pulses have been delayed with respect to the 1 megahertz clock.

The Analog Waveform

An analog waveform is generated by means of the digital to analog converter (DAC) 168 and the multiplying digital to analog converter (MDAC) 170, for example, a 7541 MDAC, as follows. The DAC 168 receives digital data in the form of a plurality of bits which represent a given value and produces an analog voltage of an equivalent value at its output. The MDAC 170, on the other hand, is a device which receives an analog voltage and scales the analog voltage (attenuates) by a value which is defined by a digital data field received at other inputs of the MDAC 170.

To produce an analog output of a continuously varying voltage, or in other words a distinctive waveform, the pipeline register 74 continuously produces a varying analog data field 148. This analog data field can be updated as rapidly as once every microsecond to enable emulation of a rapidly changing analog waveform. The DAC, which may be a 5680 12 bit DAC available from Harris Corporation, is capable of producing an analog voltage in response to a 12 bit digital input field. The 5680 DAC has a settling time of approximately 1 microsecond which provides a certain degree of smoothing as the analog voltage transitions from one voltage to another.

The two major features of an analog output are its waveform and its magnitude. For example, the analog output 172 of FIG. 8 has smaller voltage swings than the analog output 174. The present invention is organized around the concept that the DAC 168 produces an analog output 176 (FIG. 3) with the correct waveform while the MDAC 170 is employed for scaling or for adjusting the scaling or magnitude of the analog output 60 which is supplied to the various subsystems. Accordingly, the MDAC 170 includes inputs 178 which receive the general data field 84. By means of the DAC/MDAC strobe 150, respective values are loaded into the DAC 168 and into the MDAC 170 which produce an analog output 60 having a predetermined waveform and magnitude.

It should be noted that the same strobe is used for loading simultaneously the respective fields into the DAC 168 and into the MDAC 170. This arrangement avoids the possibility that the analog voltage 60 is not fully defined at any given time due to sequential loading of the DAC and the MDAC, respectively.

Analog waveform 174 shown in FIG. 8 is presented to explain the general concept of analog waveform synthesis. This contrived analog waveform includes several regions. In a first region, the output voltage is constant. In a second region, the voltage begins to increase and has the form of a sinusoid. In a third region, the analog voltage is again constant although its magnitude is higher than the previous constant value. The last section of the analog waveform consists of a monotonically increasing ramp.

To produce analog waveform 174, the microprogram memory 70 through the pipeline register 74 outputs a sequence of digital values on its analog waveform field 148 shown in FIG. 3. Please note while in the actual hardware, the analog waveform is defined by 12 bits applied to the DAC 168, for illustration purposes, only 5 bits are used in FIG. 8.

The process of generating an analog waveform is a process whereby the analog waveform field 148 is continuously updated to values which approximate the exact value of the analog waveform 174 shown in FIG. 8. In FIG. 8, the abcissa is graduated in numbers from 0 through 60. These numbers represent either time or sequential addresses which are applied to the microprogram memory 70. The ordinate axis is graduated in magnitude values which are marked by the binary numbers from 00000 to 11111 (from 0 to 31 in the decimal system). For the first five points, the analog voltage is at a level of 01000 (8). During that time, the analog waveform field 148 is set to a constant of 01000. Thereafter, the field 148 changes rapidly in an attempt to follow the increasing analog voltage. For example, at time period 5, the magnitude will rise to a binary value of 01010. At time period 7, the value will be 01111, and so on.

The sequence of values assigned to the field 148 is illustrated in FIG. 9 for the time duration from 0 to 20. It is seen that as the analog waveform changes rapidly, the values from the pipeline register will change often. But when the analog waveform is constant or changes gradually, the output from the pipeline register remains constant for a corresponding time interval. The staircase shape voltage represents the actual voltage which is produced by the digital to analog converter 168. As shown in FIG. 8 there exist significant differences between the pure analog waveform 182 and the analog waveform 174 which is output by the digital to analog converter 168. In actuality, where 12 bits are available for defining the analog waveform 174 the deviations from the exact shape of the 182 waveform are negligible.

Software Organization

The present invention is further distinguished by a unique and novel software structure which is employed for producing an analog waveform. The generation of the analog waveform will be explained by reference to the software chart illustrated flow in FIG. 10.

A straightforward and direct software approach for generating an analog waveform requires that all values of the analog waveform at all point in time be stored in a memory and recalled sequentially. For example, in FIG. 8 this would require the storage of a corresponding value for each graduation on the time scale, e.g. 1 through 60. However, such an approach requires a large initial programming investment and is impractical because a large memory capacity must be made available.

Instead, the invention employs a software structure wherein a selected group of analog waveform segments are defined and stored in data segments. Special program means in the form of subroutines concatenate the analog segments to produce a final desired analog waveform. For example, let it be assumed that a typical analog output has the shape of the waveform 172 shown in FIG. 8. The waveform 172 includes a first section A, followed by ramp section B and the sections C, D, E, F, G and H, as shown. The complete waveform 172 can be reproduced from data segments which define the sections B and F alone. The remaining sections can be produced through software means by, for example, inverting the polarity of or scaling a waveform segment. Accordingly, the section A is produced by outputting to the digital to analog converter 168, shown in FIG. 3, a constant value for a time period which corresponds to 11 units of the time scale shown in FIG. 8. The generation of a constant voltage does not require a data segment and can be generated dynamically by software. To generate the segment B, the program accesses a data segment which define a ramp B. Another data segment provides values for producing a sinusoidal segment such as segment F.

The voltage values in any data segment are stored in absolute value terms. For example, the waveform section C in FIG. 8 is a negative section of a sine wave and can be generated by accessing a data file which contains the values of a sine wave from 0° to 180° and by inverting the polarity of each value. Similarly, the section E is a negative ramp and can be generated by accessing the data file corresponding to the section B and complementing the data stored therein.

Briefly, a data segment contains a sequence of values which define a waveform. If the waveform is a sine wave from 0°–180°, for example, then the magnitude of the values will increases to a maximum at 90° and then decreases to reach the first value at 180°. Almost any other sinusoidal waveform can be generated from the above data segment. To generate a sign wave from 0°–360°, the data segment is first used as is to produce the 0°–180° segment and then the same data file is read again, except that now each value is inverted. To change the frequency of the sign wave, the time between outputting adjacent values from the data segment to the DAC 163 is increased or decreased as necessary. The scaling of the sign wave is controlled by the subroutine which uses the data segment. The subroutine outputs scaling values over the lines 148 to the MDAC 170 as shown in FIG. 3. It should be noted that the program can enter the data segment at any point thereof, so that by entering at the middle of the above-noted data file a sine wave of from 90°–180° can be generated. The last capability is particularly powerful in connection with data segments which define ramps. In connection with ramp data segments, the ability to enter at the middle point provides an inherent capability to produce a ramp of from any first value to any second value because the ramp increases monotonically.

If, however, the level of the sine wave must be changed (level shifting), then a separate data segment will be required because the address sequencer is not capable of ALU operations. However, this is not significant, because the microprogram memory is reprogrammable from the externally located central CPU 58 so that as many data segments as necessary can be generated dynamically.

To summarize, the firmware software is distinguished by having a small group of data segments for defining elementary analog waveform segments and a larger number of subroutines. Each subroutine generates a segment independently or by accessing a data segment. By executing a sequence of subroutines, a completed waveform is generated by concatenation.

FIG. 10 is a top level flow chart of the software. The flow chart will be used to describe the generation of the segments B and C of FIG. 8. The program begins with the initialization block 190. In the initialization block 190, general housekeeping and maintenance functions are performed including the presetting of constants and the resetting of all the timers in the system. Next, in the set subroutine entry address block 192, the main program initializes a general location which stores an entry address of a first subroutine 194. The first subroutine is used for controlling the generation of the segment B shown in FIG. 8. Next, the main program initializes the subroutine 194 in a block 196. The next instruction 198 instructs the program to jump to a first location of the data segment A 200. Data segment A provides a sequence of values which describe the analog segment B of FIG. 8.

At the first location 202, the data segment defines a first value for the segment B, for example the binary value 00000. Also at the first location 202 of data segment A there is stored a jump to subroutine instruction. The instruction will instruct the address sequencer to output an address value which accesses the first location of subroutine 194. The address of the first subroutine has been previously initialized in the set subroutine entry address block 192. Subroutine 1 also controls the scaling of the waveform. A scaling constant is initialized in the subroutine before execution of the subroutine begins. Then the constant is sent to the MDAC 170 of FIG. 3 (block 206) prior to accessing the first word in the segment.

The subroutine also determines the next time when the analog waveform must be updated. If updating is not required, the address sequencer may dwell at the same location to save memory unless another output of the synthesizer requires updating. In decisional block 204, the subroutine determines when an end of segment has been reached. For example, if determination is made that the end of segment has not been reached, the subroutine produces a next address which points to the second entry 208 in data segment A. A voltage output corresponding to the next point is then retrieved from data segment A. A jump to subroutine instruction then returns control to subroutine 1 which responds by outputting the second value. Thereby, the segment B shown in FIG. 8 is synthesized point by point by means of data segment A and subroutine 1. When the last point in the segment B has been outputted, a YES result will issue from the decisional block 204 and the program will fall through to the continue block 210.

The data file B of FIG. 10 describes, for example, one-half of a sine wave. To generate the segment C of FIG. 8, the main program sets a new subroutine entry address at program block 212. Consquently, a jump to subroutine instruction will generate an address from the address sequencer which accesses the second subroutine 214. Initialize subroutine block 216 is similar to the block 196 but operates on the second subroutine 214.

The generation of segment C proceeds in a manner identical to the generation of the previous segment and involves an orderly progression through data file B to retrieve therefrom a sequence of values which define a sinusoid. As part of the initialization of subroutine 2, subroutine 2 is instructed to invert all the values obtained from data file B to generate the negative going sinusoid segment C of FIG. 8. When the last point of the sinusoid has been output, the end-of-segment decisional block 218 will provide a YES result and the subroutine will continue to the main program.

In summary, the program structure as defined above is capable of obtaining a very modular software structure which significantly reduces the memory requirements of the synthesizer 50.

The software structure described thus far simplifies software design. For example, for generating a plurality of data segments, a specialized program in the form of a macro, which is not part of the final program stored in hardware, is used for generating sequences of points for each data file. To generate a particular waveform shape, the programmer must only specify which data segments are required in accordance with the elementary waveform segments that make up the given waveform. A sequence of subroutines, all of the same structure, are generated to access respective data segments for generating a composite waveform such as, for example, the waveform 174 of FIG. 8.

D.

THE INTERCHANNEL COMMUNICATION BUS

FIG. 7 is a timing diagram showing examples of analog waveforms produced by the function generator in accordance with the present invention. The signals $G_x$, $G_z$, and $G_y$ are used driving the gradient power supply drivers 18 of FIG. 1. The waveforms RF and $RF_{imag}$ are used for driving the RF transmitter 20. In accordance with the present invention, each of these waveforms is generated by a respective synthesizer module 50 of the function generator 12. Curved arrows 220, 222, for example, show a triggering timing relationship between the various waveforms.

For example, the arrow 224 indicates that at point 2 when the waveform RF approaches zero, the waveform $G_y$ must begin the generation of down curving sinusoidal segment while the waveform $G_x$ and $G_z$ must begin a generation of a negatively sloping ramp (arrows 220 and 222). Similarly, at time period 3, the waveform $G_z$ reaches a value of zero and the arrows 226 and 228 indicate that the waveforms $G_x$ and $G_y$, respectively, must begin the generation of the sinusoidal waveforms 230 and 232, respectively. This relationship also holds true for the other curved arrows which appear in FIG. 7.

In addition to the interrelated timing between the waveforms $G_x$, $G_y$, $G_z$, RF and $RF_{imag}$, there exists a predetermined time relationship between the convert command waveform 234 and other waveforms which control the generation of the magnetic fields in the magnets 14.

Because each of the analog waveforms referred to above is generated in different synthesizer modules 50, the synthesizers 50 must synchronize their operation to obtain the desired timing relationship. This is provided by the interchannel communication bus 66 which is shown in FIG. 2 and which has a structure in accordance with a preferred embodiment shown in FIG. 4.

FIG. 4 shows three synthesizers 1, 2 and 10. The interchannel communication bus 66 consists of a plurality of lines 236 including at least as many lines as there are synthesizers 50 in the function generator 12. In FIG. 4, six such lines are shown. The individual synthesizers are connected to these lines in a manner so that each synthesizer treats a single but different line as an input line and uses the remaining number of lines as output lines. For example, it can be seen that the synthesizer 1 in FIG. 4 is wired to receive interchannel communication bus line 238 as an input line while the remaining interchannel communication bus lines are wired as output lines. Synthesizer 2, on the other hand, uses the next interchannel communication bus line 240 as an input line, while synthesizer 10 uses the last interchannel communication bus line as an input line.

Each of the synthesizers monitors its input line to determine whether the line is active. An active state can be a logic 0 or a logic 1, in accordance with a predetermined protocol. Therefore, the synthesizer 1, for example, can be programmed to suspend its operation at a certain point in its program and to begin testing the status of its input line. If its input line is inactive, it will wait until the state of the line changes to an active state. A first step after sensing that its input line was activated will be to deactivate its own line so that the line may thereafter be activated again by the other synthesizers 50. It should be noted that the input 238 of synthesizer 1 represents an output line to the remaining synthesizers 2–10. Therefore, any of the remaining synthesizers can activate the input line of the first synthesizer. Similarly, the input line 240 of synthesizer 2 is wired as an output line to the remaining synthesizers, and so on for every one of the remaining synthesizers.

In this manner, for example, the synchronization of the waveforms in FIG. 7 can be achieved by having the waveforms $G_x$, $G_y$, $G_z$, RF and $RF_{imag}$ generated, respectively, by five synthesizers to generate, respectively, the waveforms $G_x$, $G_y$, $G_z$ RF and $RF_{imag}$. Synthesizer 4, which would generate for example the waveform RF, would set the input lines of the synthesizers 1–3 to an active state at time period 2 (FIG. 7). Synthesizers 1–3 will not proceed beyond the point 2 until synthesizer 4 has activated their respective input lines. On the other hand, synthesizer 2 will control the activation of the input lines of synthesizer 1 and 3 to synchronize the generation of the sinusoidal waveforms $G_x$ and $G_y$ between the time marks 3 and 4.

The interchannel communication bus lines 236 can be tristate or open collector lines so that more than one synthesizer 50 can activate any of the other synthesizers' input lines.

The interchannel communication bus provides a means independent of the main data addressing control bus for synchronizing the operation of the individual synthesizers.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. A waveform synthesizer for generating at least one analog waveform and a plurality of digital outputs for an NMR imaging system, said synthesizer unit comprising:
   (a) address sequencer means for producing a sequence of dynamically modifiable addresses;
   (b) a programmable memory for storing therein digital and control information in the form of data words, each of the data words including a plurality of data fields, the programmable memory being responsive to said addresses to output said data words;
   (c) a pipeline register coupled to said memory and having a capacity to hold at least one of said data words, said address sequencer means being coupled to said pipeline register and receiving therefrom an instruction field which defines an operation to be performed by said address sequencer means and digital output fields which define the state of said digital outputs, said addresses produced by said address sequencer means being developed in accordance with said instruction field from said pipeline register;
   (d) means for producing said analog waveform, said means being coupled to said pipeline register and being responsive to an analog data field of said pipeline register to produce said analog waveform;
   (e) means for receiving data from a source external to said synthesizer and entering said data into said programmable memory, whereby the waveshape of said analog waveform and digital output may be altered;
   (f) means for receiving external input signals for dynamically modifying synthesizer activities in accordance with external events;
   (g) a system clock generating means for producing a clock signal which determines the frequency at which said addresses are generated, said system clock means including means for producing a first clock output having clock pulses of a predetermined frequency, at least said address sequencer means and said pipeline register being coupled to said clock signal and being synchronized to said clock signal; and
   (h) at least one interval timer counter for timing events of said synthesizer for producing time delays.

2. The synthesizer of claim 1, wherein said system clock generating means further includes means for producing intermediate clock pulses can be interposed between adjacent pulses of said clock pulses of said first clock output.

3. The synthesizer of claim 2, wherein said intermediate clock pulses are enabled for carrying out additional control instructions within said synthesizer.

4. The synthesizer of claim 2, wherein said programmable memory is a RAM memory.

5. The synthesizer of claim 4, wherein each said data words is a 64 bit wide data word.

6. The synthesizer of claim 4, wherein said RAM memory is responsive to said addresses to produce a respective data word after a delay of between 50 to 100 nanoseconds.

7. The synthesizer of claim 4, wherein said RAM memory includes a data output port, said pipeline having inputs connected to said data output port and a clock input for clocking data present at said data output port into said pipeline register in response to said clock signal.

8. The synthesizer of claim 7, wherein at least a plurality of said data words include said instruction field, a general data field, a DAC field, a digital outputs field, and a control outputs field.

9. The synthesizer of claim 8, wherein said general data field and said instruction field are coupled to said address sequencer.

10. The synthesizer of claim 8, wherein said control outputs field include a fast clock enable output for enabling said intermediate clock pulses.

11. The synthesizer of claim 10, wherein said clock signal produces said clock pulses to have a frequency of at least 5.3 MHZ.

12. The synthesizer of claim 8, wherein said plurality of digital outputs are defined by said digital output field.

13. The synthesizer of claim 12, wherein said digital outputs are synchronized to said clock pulses of said first clock output and further comprising means for selectively delaying at least one of said digital outputs with respect to said clock output.

14. The synthesizer of claim 13, wherein said predetermined frequency of said first clock output is about 1 MHZ and wherein said selective delaying means are adapted to delay said at least one digital output by up to 1 u sec in increments of about 62.5 nanoseconds.

15. The synthesizer of claim 14, wherein said at least one digital output is usable for triggering an analog to digital converter.

16. The synthesizer of claim 2, wherein said analog waveform producing means include a digital to analog converter coupled to said pipeline register for producing an intermediate analog output in response to a DAC field from said pipeline register and a multiplying digital to analog converter for scaling said intermediate analog output and producing said analog waveform.

17. The synthesizer of claim 16, wherein said multiplying digital to analog converter includes means responsive to a data field from said pipeline register for adjusting the scaling level of said multiplying digital to analog converter.

18. The synthesizer of claim 17, including means for synchronously storing said digital to analog converter field and said data field for said multiplying digital to analog converter in said digital to analog converter and said multiplying digital to analog converter, respectively.

19. The synthesizer of claim 17, further comprising program means for synthesizing said at least one analog waveform, said program means including data segment means for defining a set of elementary waveform segments, subroutine means for generating said at least one analog waveform by concatenating said elementary waveform segments, and program control means for controlling the sequence of access to said data segment means and said subroutine means.

20. The synthesizer of claim 19, wherein said set of elementary waveform segments include sinosoidal and ramp segments.

21. The synthesizer of claim 1, further comprising input means for sensing the presence of at least one input signal received by said means for receiving external signals, and means for synchronizing predefined operations of said synthesizer to the activation of said input signal.

22. The synthesizer of claim 21, wherein said at least one input signal is a signal indicative of the physiological states of a patient.

23. The synthesizer of claim 1, wherein said means for entering data into said memory includes:
(a) means for interfacing said synthesizer to a address/data/control bus;
(b) address and data buffers selectively coupleable to said memory; and
(c) a control logic means for producing control outputs for said address sequencer means and for said data entry means to arbitrate access to said programmable memory and to control data entry into said memory.

24. The synthesizer of claim 23, wherein said RAM is organized in data words which are larger than the data width of said data buffers.

25. The synthesizer of claim 24, wherein said data words of said RAM are 64 bit wide and said data buffer is 16 bits wide and wherein said control means for entering data into said memory includes means for selectively enabling a portion of said memory for entering data thereinto.

26. The synthesizer of claim 23, wherein said control logic circuit includes programmable array logic (PAL) integrated circuits programmable to generate said control outputs whereby modification of said control outputs is effected by PAL substitution instead of circuit interconnection modifications.

27. A function generator for an NMR imaging system, said function generator comprising:
(a) a plurality of, independently operable, waveform synthesizers, each said synthesizers including:
  a memory; address sequencer means for producing a sequence of dynamically modifiable addresses for said memory;
  program data stored in said memory;
  means for sequentially retrieving portions of said data from said memory in accordance with said sequence of addresses, said data retrieved from said memory including an instruction field for controlling the operation of said address sequencer means, an analog waveform field for defining at least one analog waveform output, a digital output field for producing a plurality of digital outputs;
  analog waveform synthesizing means for producing analog waveforms from said analog waveform field;
  program means for generating said analog waveform fields; and
  external input signal receiving means for dynamically modifying synthesizer activities in accordance with external events;
(b) a central controller connected to said plurality of waveform synthesizers and including means for loading said memory of each said plurality of synthesizer with said program data;
(c) a data/address/control bus for interconnecting said central controller and said plurality of waveform synthesizers; and
(d) interchannel communications bus means for interconnecting said plurality of waveform synthesizers in a manner which allows each said plurality of waveform synthesizers to signal every other one of said plurality of waveform synthesizers, whereby the operation of said plurality of waveform synthesizers can be synchronized.

28. The function generator of claim 27, wherein said interchannel communication bus means are in a form of a plurality of lines, each one of said synthesizers being responsive to sense the activation of a given respective one of said lines and each one of said plurality of waveform synthesizers being adapted to activate others than the line it is responsive to whereby each said waveform synthesizers can signal any or all of the others of said waveform synthesizers.

29. The function generator of claim 27, wherein each one of said plurality of waveform synthesizers is a printed circuit board, wherein said bus includes a back plane which is adapted to receive said printed circuit boards whereby a modular, configurable and expandable function generator for an NMR imaging system is provided.

30. The function generator of claim 27, wherein each one of said plurality of waveform synthesizers comprises system clock generating means for producing a clock signal having first clock pulses of a predetermined frequency, and intermediate clock pulses which can be interposed between said first clock pulses of said predetermined frequency.

31. The function generator of claim 30, wherein said intermediate clock pulses are produced for carrying out additional control instructions within said synthesizer.

32. The function generator of claim 30, wherein each one of said waveform synthesizers further comprises input means for sensing the presence of at least one input signal received by said means for receiving external signal receiving means, and means for synchronizing predefined operations of said waveform synthesizer to the activation of said input signal.

33. The function generator of claim 30, wherein each one of said waveform synthesizer further comprises a pipeline register and wherein said analog waveform synthesizing means include a digital to analog converter coupled to said pipeline register for producing an intermediate analog output in response to a changing digital to analog converter field from said pipeline register and an multiplying digital to analog converter for scaling said intermediate analog output and producing said analog waveform.

34. The function generator of claim 30, wherein said program means of each one of said plurality of waveform synthesizers include data segment means for defining a set of elementary waveform segments, subroutine means for generating at least a DAC field by concatenating said elementary waveform segments, and program control means for controlling the sequence of access to said data file means and said subroutine means.

35. The function generator of claim 30, further comprising a host computer interface unit for allowing said function generator to interface to a data processing computer.

36. The function generator of claim 30, further comprising a global memory in the form of a printed circuit board interconnected to said data/address/control bus to provide a central memory for said central controller and said plurality of waveform synthesizers.

37. An NMR imaging system, comprising:
   a magnet for producing at least one magnetic field adapted to surround at least a portion of a patient;
   a transmitter and a gradient power supply for powering and controlling said magnets;
   a receiver for sensing electromagnetic radiation emitted from said patient in response to said at least one magnetic field;
   a function generator connected to said transmitter and said receiver for producing a plurality of analog waveforms for operating said transmitter and said gradient power supply, said function generator including;
   (a) a central controller module;
   (b) a plurality of modularly constructed waveform synthesizers for producing said plurality of analog waveforms, each of said waveform synthesizers comprising
   i. a memory;
   ii. an address sequencer for producing a sequence of dynamically modifiable addresses for said memory;
   iii. means for entering data into said memory from said central controller;
   iv. means for sequentially retrieving portions of said data from said memory in accordance with said sequence of addresses, said data retrieved from said memory including an instruction field for controlling the operation of said address sequencer, an analog waveform field for defining at least one analog waveform and digital output field for defining a plurality of digital outputs;
   v. analog waveform synthesizing means for producing at least one of said analog waveforms;
   vi. program means for generating said analog waveform field;
   vii. external input signal receiving means for modifying synchronizer activities in accordance with external events; and
   viii. an interchannel communication bus means for interconnecting each said waveform synthesizers in a manner that allows the operation of said plurality of waveform synthesizers to be synchronized to one another;
   an analog to digital converter (ADC) for receiving said electromagnetic radiation from said patient and converting said radiation into a digital signal, said ADC being controlled to produce said digital output by at least one of said waveform synthesizers; and
   computer and display means for receiving said digital data from said analog to digital converter, analyzing said data, composing an image of internal structures of said patient, and displaying said image.

38. The imaging system of claim 37, wherein each one of said waveform synthesizers comprises system clock generating means for producing a clock signal having first clock pulses of a predetermined frequency, and means for producing intermediate clock pulses which can be interposed between said first clock pulses for generating additional addresses to carry out additional control instructions.

39. The imaging system of claim 38, wherein at least one of said plurality of waveform synthesizers includes means for sensing the pressure of at least one input signal received by said external input signal receiving means which represents a physiological status of said patient and means for synchronizing the operation of said at least one synthesizer to said input signal.

40. The imaging system of claim 38, wherein said at least one waveform synthesizer further comprises means for generating a convert command output for said analog to digital converter, said convert command output being generated at predetermined time after the sensing of said input signal.

41. The imaging system of claim 38, wherein said program means include data segment means for defining a set of elementary waveform segments, subroutine means for generating at least a DAC field and other fields by concatenating said elementary waveform segments, and program control means for controlling the sequence of access to said data segment means and said subroutine means.

* * * * *